United States Patent
Kahlisch et al.

(10) Patent No.: US 6,605,864 B2
(45) Date of Patent: Aug. 12, 2003

(54) SUPPORT MATRIX FOR INTEGRATED SEMICONDUCTORS, AND METHOD FOR PRODUCING IT

(75) Inventors: Knut Kahlisch, Dresden (DE); Henning Mieth, Jahnsdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/901,524

(22) Filed: Jul. 9, 2001

(65) Prior Publication Data

US 2002/0006688 A1 Jan. 17, 2002

(30) Foreign Application Priority Data

Jul. 7, 2000 (DE) .......................... 100 34 018

(51) Int. Cl.⁷ .................... H01L 23/495; H01L 23/12
(52) U.S. Cl. .................. 257/666; 257/667; 257/668; 257/673; 257/676; 257/693; 257/701
(58) Field of Search ................. 257/667, 668, 257/673, 666, 676, 786, 783, 782, 773, 737, 693, 701, 702, 678; 438/123, 124

(56) References Cited

U.S. PATENT DOCUMENTS

| 5,422,313 A | 6/1995 | West |
| 5,744,859 A | 4/1998 | Ouchida |
| 5,756,377 A | 5/1998 | Ohsawa |
| 5,866,949 A | 2/1999 | Schueller |
| 5,915,170 A | 6/1999 | Raab et al. |
| 2001/0035575 A1 * | 11/2001 | Miyazaki et al. ........... 257/690 |

FOREIGN PATENT DOCUMENTS

| EP | 0 472 766 A1 | 8/1992 |
| JP | 01 173 734 | 7/1989 |
| JP | 01217952 A | 8/1989 |
| JP | 04 029 342 | 1/1992 |
| JP | 05 211 209 | 8/1993 |
| JP | 10214924 A | 8/1998 |

* cited by examiner

Primary Examiner—Minh Loan Tran
Assistant Examiner—Tan Tran
(74) Attorney, Agent, or Firm—Laurence A. Greenberg; Werner H. Stemer; Ralph E. Locher

(57) ABSTRACT

Support matrices for semiconductors are often disposed with spacers on the semiconductor chip. The spacers are composed of silicone that flows into the region of the bonding leads and prevents reliable electrical connection of the bonding leads to the semiconductor chip. In order to prevent the flow, the support matrix for integrated semiconductors has a frame, conductor track structures and at least one bonding lead for connecting the conductor track structures to the integrated semiconductor. The bonding lead has, between a bonding region and the conductor track structures, at least one barrier for preventing the flow of flowable material onto the bonding region. A method for producing such support matrices is likewise described.

10 Claims, 2 Drawing Sheets

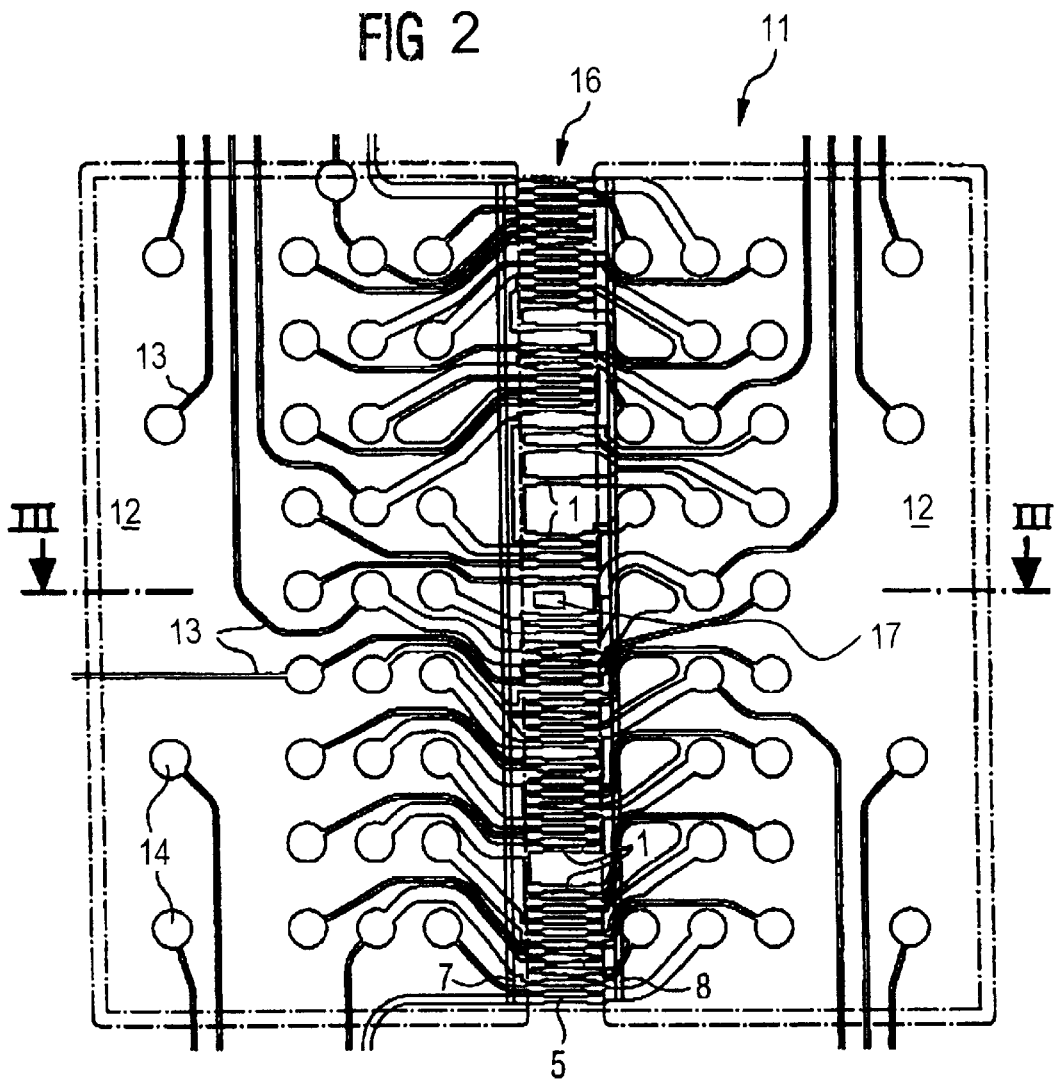
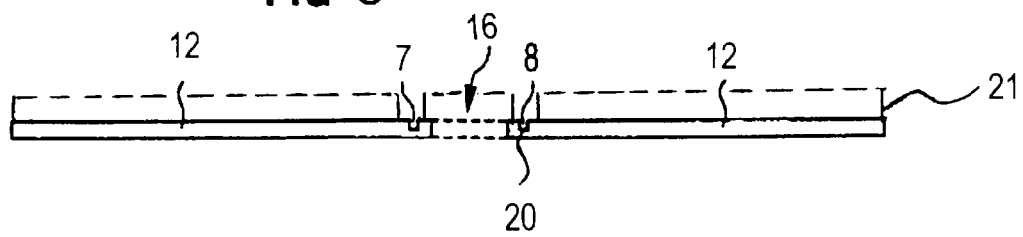

SUPPORT MATRIX FOR INTEGRATED SEMICONDUCTORS, AND METHOD FOR PRODUCING IT

BACKGROUND OF THE INVENTION

Field of the Invention

The invention relates to a support matrix for integrated semiconductors having a barrier at the bonding leads, and a method for producing such a support matrix.

Modern miniature housings for integrated semiconductors such as µBGA, FBGA, etc. contain a support matrix in addition to the actual encapsulation and a silicon chip. The support matrix serves for stabilization and electrical connection of contact pads of the semiconductor chip to external contacts of the housing. For this purpose, the support matrix has a frame, for example a suitably shaped polyimide film having a thickness of 50 µm, for example, and also a conductor track structure that connects the contact pads to one another. Usually, the semiconductor chip is connected to one side of the support matrix, while contacts for externally connecting the housing on a circuit board or the like are disposed on the other side of the support matrix. The conductor track structure is usually disposed on that side of the frame on which the semiconductor chip is also located, while the external contacts are located on the other side. The connection between the conductor track structures and the external contacts is achieved through holes in the frame.

The actual connection between the conductor track structures and the semiconductor chip is effected by so-called bonding leads, that is to say tongue-like regions on the conductor track structure which are bent or can be bent towards the semiconductor chip in order to make contact with the contact pads of the semiconductor chip. The bonding leads are then bonded to the semiconductor, for example by welding, microwelding methods or soldering.

In a customary procedure, the bonding leads are concentrated in a so-called bonding channel. The bonding channel is an opening in the frame that allows access to the bonding leads from the side remote from the semiconductor chip. During the mounting of the support matrix onto the semiconductor chip, from that side of the support matrix that is remote from the semiconductor chip, the bonding leads are pressed by bonding punches towards the semiconductor chip and bonded there.

The bonding leads are connected to the remainder of the conductor track structures via a so-called anchor. On the side opposite to the anchor there is often a mating anchor that is connected to the actual bonding region of the bonding lead via a desired breaking point. When the bonding region is pressed onto the contact point of the semiconductor chip, the desired breaking point tears.

Between the support matrix and the semiconductor chip spacers are often inserted, so-called nubbins, which bring about the desired spacing between the two components. The nubbins are usually produced from a silicone material and applied to the support matrix by screen printing. In order to stabilize the connection between the support matrix and the semiconductor chip, the bonding channels are filled with a suitable material.

During the production of the nubbins by screen printing, the situation where silicone material passes onto the electrical connecting lines, in particular the bonding leads, on account of insufficient sealing by the printing screen cannot be ruled out. As a result of the specific properties of the silicone material, the latter creeps as far as the areas of the connecting lines that, in the further process sequence, serve for making contact with the semiconductor chip. Since the silicone material is thus present between the bonding region of the bonding lead and the contact pad of the semiconductor chip, electrical contact-connection cannot be achieved, or at least cannot be reliably ensured, during the bonding operation. In order to prevent such problems, attempts have hitherto been made, using diverse preventive measures, such as the cyclic cleaning of the screens during the production process, or using various post treatment methods, such as plasma cleaning or chemical cleaning, to prevent the contamination of the bonding regions of the bonding leads. However, this has not made it possible to achieve a reliable contact pad freed of silicone contamination in all cases.

SUMMARY OF THE INVENTION

It is accordingly an object of the invention to provide a support matrix for integrated semiconductors, and a method for producing it which overcomes the above-mentioned disadvantages of the prior art devices and methods of this general type, which can reliably prevent creepage of the silicone material into the bonding region.

With the foregoing and other objects in view there is provided, in accordance with the invention, a support matrix for integrated semiconductors. The support matrix includes a frame and conductor track structures running on the frame. The conductor track structures have at least one bonding lead for connecting the conductor track structures to an integrated semiconductor. Flowable silicon structures are disposed in a region of the bonding lead and serve to space apart the support matrix and the integrated semiconductor. The bonding lead has a bonding region and the groove is formed between the bonding region and the conductor track structures. The groove functions as a barrier for preventing a flow of the flowable silicon structures onto the bonding region.

The invention is first directed at the support matrix for integrated semiconductors having the frame, the conductor track structures and the at least one bonding lead for connecting the conductor track structures to the integrated semiconductor. The support matrix is characterized in that the bonding lead has, between a bonding region and the conductor track structures, at least one barrier for preventing the flow of a flowable material from the bonding region.

Consequently, the inventive basic concept is that, instead of implementing costly cleaning measures, the bonding leads are reconfigured in such a way that an integrated barrier prevents the creepage of the silicone material used for the nubbins into the bonding region.

The barrier constitutes a parting line for the flowable material between the conductor tracks and the frame, on the one hand, and the bonding lead, on the other hand. The barrier is expediently oriented in such a way that it reaches over the entire bonding lead transversely with respect to the possible flow direction of the silicone material. The flowable material is preferably silicone for forming structures on the support matrix. The structures may be spacers in this case.

In principle, the invention is also suitable for preventing flowable materials other than the silicone materials used for nubbins from creeping on the bonding region, so that the invention can also be used for other technologies in the area of producing support matrices and semiconductors.

The bonding lead may have an anchor for connecting to the frame and the barrier may be disposed in the region of the anchor.

Furthermore, the bonding lead according to the invention may have a mating anchor for connecting its end remote from the anchor to the frame, a second barrier is disposed in the region of the mating anchor. This preferred embodiment can be used if the bonding leads have a mating anchor and a desired breaking point which is connected to the frame on that side of the bonding channel which is opposite to the anchor, as described above. In this case, it may be necessary to protect against both possible flow directions of the flowable material using barriers.

Various possibilities are available for the configuration of the barrier. Thus, the barrier may have a groove or a wall. When a groove is used, the edge effect for flow and adhesion of flowable material is exploited, in which a flowable material is unable to flow around an edge directed downward. In this way, a groove can constitute an effective barrier for liquids. The use of a wall, that is to say projecting barrier element, can also have a limiting effect that is dependent on the adhesion properties of the flowable material on the bonding lead.

Finally, the barrier may have a region with a parting agent that repels the flowable material. In this case, then, the adhesiveness of the flowable material on the substrate is altered by the use of a coating in such a way that it is unable to creep over the coated region onto the bonding region to be protected.

It is possible to combine different types of the barriers discussed above with one another or to dispose a plurality of identical barriers one after the other on the bonding lead. Such measures can further improve the retaining effect of the barrier according to the invention, although with increased outlay.

Furthermore, the invention is directed at a method for producing a support matrix for integrated semiconductors having a frame, conductor track structures and at least one bonding lead for connecting the conductor track structures to the integrated semiconductor. The method includes the incorporation of the groove between a bonding region and the conductor track structures for preventing the flow of flowable material on the bonding region.

In this case, the method according to the invention can preferably be effected photochemically and includes an application of a resist mask and the etching of transverse grooves into the anchor of the bonding lead.

The resist mask is applied e.g. in a manner familiar to the person skilled in the art by coating with a photoresist, exposure of the desired pattern and development of the resist layer.

As an alternative, the method includes embossing of transverse grooves into the anchor of the bonding lead.

In order to reinforce the barrier effect, it may be preferred for a plurality of barriers running parallel to be connected one after the other.

During the production of grooves, the etching depth or embossing depth must be dimensioned such that a desired breaking point that may be present between bonding region and mating anchor continues to function as such during the mounting of the bonding leads. In other words, breaking when the bonding region is pressed onto the semiconductor chip should not take place at the barriers.

Finally, the invention is directed at a method for producing a support matrix for integrated semiconductors having a frame, conductor track structures and at least one bonding lead for connecting the conductor track structures to the integrated semiconductor. The method includes the application of at least one wall between a bonding region of the bonding lead and the conductor track structures for preventing the flow of flowable material onto the bonding region.

The application of the material can be achieved using customary methods for producing semiconductors, such as, for example, coating methods with plasma deposition.

The barriers can be produced during the integrated production of the conductor track structures and bonding leads and before their connection to the frame of the support matrix. As an alternative, it is also possible to provide the barriers after the connection of frame and conductor track structure/bonding lead layer.

Other features which are considered as characteristic for the invention are set forth in the appended claims.

Although the invention is illustrated and described herein as embodied in a support matrix for integrated semiconductors, and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a plan view of a support matrix incorporating the bonding leads; and

FIG. 3 is a sectional view of the support matrix.

DESCRIPTION OF THE PREFERRED EMBODIMENTS

Figure 1:
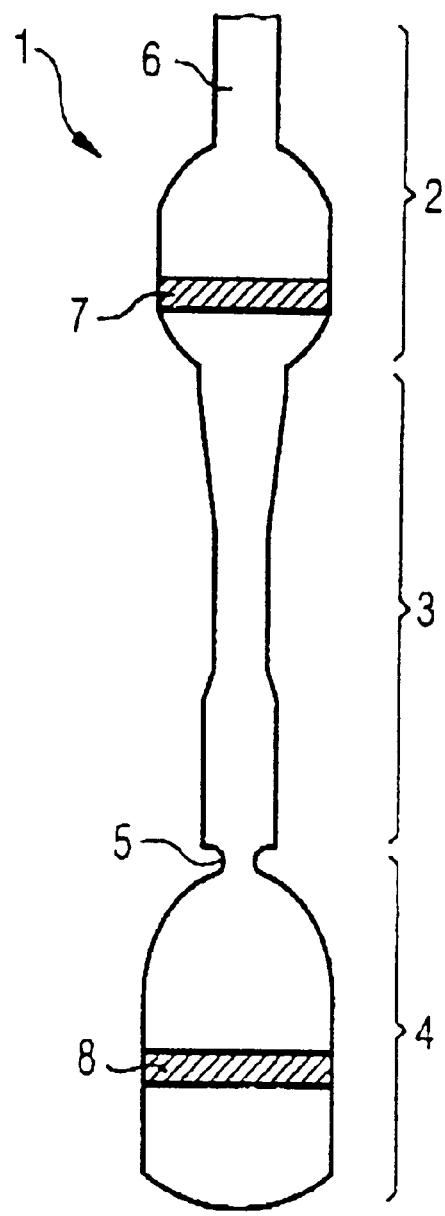
FIG. 1 is a diagrammatic, plan view of a bonding lead according to the invention.

In all the figures of the drawing, sub-features and integral parts that correspond to one another bear the same reference symbol in each case. Referring now to the figures of the drawing in detail and first, particularly, to FIG. 1 thereof, there is shown a bonding lead 1 according to the invention. The bonding lead 1 is shown in conjunction with barriers 7, 8. The bonding lead 1 has an anchor region 2, a bonding region 3 and a mating anchor region 4. A desired breaking point 5 is provided between the mating anchor region 4 and the bonding region 3. At its end remote from the bonding region 3, the anchor 1 is connected by a conductor run 6 to conductor track structures of a support matrix 11 (see FIGS. 1 and 2). A first barrier in the form of a groove 7 is disposed on the anchor 2 (FIG. 1). A second barrier in the form of a groove 8 is disposed on the mating anchor 4. The barriers 7, 8 according to the invention prevent or significantly delays a flow of a flowable material along the bonding leads 1, so that contamination can be completely ruled out, or, during subsequent cleaning steps, minimal contamination residues that may still be present on the contact areas, that is to say the bonding region 3, can be reliably eliminated.

FIG. 2 shows that the support matrix 11 is formed of a frame 12 having a bonding channel 16 formed therein. The bonding leads 1 are generally disposed in the bonding channel 16. The conductor track structures are formed of a conductor track 13 and corresponding pads 14.

Between the support matrix 11 and a semiconductor chip, spacers 17 are often inserted, so-called nubbins 17, which bring about the desired spacing between the two components. The nubbins 17 are usually produced from a silicone material and applied to the support matrix by screen printing. In order to stabilize the connection between the support matrix 11 and the semiconductor chip, the bonding channel 16 is filled with a suitable material such as a flowable silicon forming silicon structures.

FIG. 3 is a sectional view of the support matrix 11 showing the frame 12 with the grooves 7, 8. The grooves or barrier 7, 8 may have a region with a parting agent 20 disposed thereon which repels the flowable material. In this case, then, an adhesiveness of the flowable material is altered by the use of the coating 20 in such a way that it is unable to creep over the coated region onto the region to be protected.

One method of forming the grooves 7, 8, requires the application of a resist mask 21 over the frame 12 and then a latter etching process for forming the grooves 7, 8. Another method of forming the grooves 7, 8 is to emboss them in at least one of the frame 12, the conductor track structures, and the bonding leads 1.

We claim:

1. A support matrix for an integrated semiconductor with a contact, comprising:

a frame;

conductor track structures running on said frame;

at least one bonding lead for connecting said conductor track structure to the integrated semiconductor; and flowable silicone structure disposed in a region of said at least one bonding lead and spacing apart the support matrix and the integrated semiconductor;

said at least one bonding lead having a bonding region to be pressed onto the contact point of the integrated semiconductor, and a barrier formed on a surface of said at least one bonding lead carrying said bonding region preventing a flow of said flowable silicone structure onto said bonding region;

said at least one bonding lead having an anchor and a mating anchor disposed opposite said anchor for connecting to said frame, said barrier being disposed in a region of said anchor, and said at least one bonding lead having a further barrier disposed in a region of said mating anchor.

2. The support matrix according to claim 1, wherein said barrier constitutes a parting line for said flowable silicon structures between said conductor track structures and said frame, on the one hand, and said bonding lead, on the other hand.

3. The support matrix according to claim 1, wherein said flowable silicon structures are spacers.

4. The support matrix according to claim 1, wherein said flowable silicon structures are formed of a flowable material and said barrier has a region with a parting agent disposed thereon for repelling said flowable material.

5. A method for producing a support matrix for an integrated semiconductor with a contact point which, comprises the step of:

providing a frame having conductor track structure disposed thereon, and at least one bonding lead connected to the conductor track structure for connecting the conductor track structure to an integrated semiconductor, the at least one bonding lead having a bonding region to be pressed onto the contact point, an anchor and a mating anchor disposed opposite the anchor for connecting to the frame;

forming flowable silicone structure on the frame serving to space apart the support matrix and the semiconductor; and forming a barrier in region of the anchor and a further barrier in a region of the mating anchor for preventing the flow of the flowable silicone structure onto the bonding region.

6. The method according to claim 5, which comprises:

applying a resist mask; and etching the at least one groove into an anchor region of the at least one bonding lead.

7. The method according to claim 5, which comprises embossing the at least one groove into an anchor region of the at least one bonding lead.

8. A support matrix for an integrated semiconductor with a contact point, comprising:

a frame;

conductor track structure running on said frame, said conductor track structure having at least one bonding lead for connecting said conductor track structure to the integrated semiconductor; and silicone structure disposed in a region of said at least one bonding lead and spacing apart the support matrix and the integrated semiconductor, said silicone structure formed from a flowable material;

said at least one bonding lead having a bonding region to be pressed onto the contact point of the integrated semiconductor, and a barrier formed on a surface of said at least one bonding lead carrying said bonding region preventing a flow of said flowable material onto said bonding region before said silicone structures solidify;

said at least one bonding lead having an anchor and a mating anchor disposed opposite said anchor for connecting to said frame, said barrier being disposed in a region of said anchor, and said at least one bonding lead having a further barrier disposed in a region of said mating anchor.

9. The support matrix according to claim 1, wherein said barrier is a grove.

10. The support matrix according to claim 1, wherein said barrier is a wall.

* * * * *